US010847499B2

United States Patent
Yazdani

(10) Patent No.: US 10,847,499 B2
(45) Date of Patent: Nov. 24, 2020

(54) STACKING INTEGRATED CIRCUITS CONTAINING SERIALIZER AND DESERIALIZER BLOCKS USING THROUGH VIA

(71) Applicant: BroadPak Corporation, San Jose, CA (US)

(72) Inventor: Farhang Yazdani, Santa Clara, CA (US)

(73) Assignee: BroadPak Corporation, San Jose, CA (US)

( * ) Notice: Subject to any disclaimer, the term of this patent is extended or adjusted under 35 U.S.C. 154(b) by 0 days.

(21) Appl. No.: 16/716,444

(22) Filed: Dec. 16, 2019

(65) Prior Publication Data
US 2020/0118980 A1 Apr. 16, 2020

Related U.S. Application Data

(63) Continuation of application No. 16/355,740, filed on Mar. 16, 2019, now Pat. No. 10,522,516, which is a
(Continued)

(51) Int. Cl.
*H01L 23/48* (2006.01)
*H01L 23/52* (2006.01)
(Continued)

(52) U.S. Cl.
CPC ........ *H01L 25/0657* (2013.01); *H01L 23/481* (2013.01); *H01L 23/66* (2013.01); *H01L 24/48* (2013.01); *H01L 2224/32145* (2013.01); *H01L 2224/48091* (2013.01); *H01L 2224/48227* (2013.01); *H01L 2224/73265* (2013.01); *H01L 2225/06513* (2013.01); *H01L 2225/06517* (2013.01); *H01L 2225/06527* (2013.01); *H01L 2225/06541* (2013.01); *H01L 2225/06572* (2013.01); *H01L 2924/00014* (2013.01);
(Continued)

(58) Field of Classification Search
CPC ....... H01L 2924/00; H01L 2924/00014; H01L 2224/32145; H01L 2224/48091; H01L 2224/48227; H01L 2224/73265; H01L 2924/10253; H01L 2924/14; H01L 2924/181; H01L 2924/30107; H01L 2224/45015; H01L 2224/45099; H01L 2924/00012; H01L 2924/207; H01L 2225/06513; H01L 2225/06517; H01L 2225/06527; H01L 2225/06541; H01L 2225/06572; H01L 23/481; H01L 23/66; H01L 24/48; H01L 25/0657; H01L 2924/19041; Y10T 29/53174; Y10T 29/53178; Y10T 29/53183
See application file for complete search history.

(56) References Cited

U.S. PATENT DOCUMENTS 6,740,981 B2 * 5/2004 Hosomi .................. G11C 8/12
257/686
7,105,871 B2 * 9/2006 Or-Bach ............... H01L 23/525
257/203
(Continued)

*Primary Examiner* — Yuriy Semenenko
(74) *Attorney, Agent, or Firm* — Aslan Law, P.C.

(57) ABSTRACT

Methods and systems for stacking multiple chips with high speed serializer/deserializer blocks are presented. These methods make use of Through Via (TV) to connect the dice to each other, and to the external pads.

22 Claims, 12 Drawing Sheets

Related U.S. Application Data continuation of application No. 13/192,217, filed on Jul. 27, 2011, now Pat. No. 10,236,275, which is a continuation of application No. 12/205,875, filed on Sep. 6, 2008, now Pat. No. 8,014,166.

(51) Int. Cl.
  *H01L 23/40* (2006.01)
  *H01L 25/065* (2006.01)
  *H01L 23/66* (2006.01)
  *H01L 23/00* (2006.01)

(52) U.S. Cl.
  CPC ............... *H01L 2924/10253* (2013.01); *H01L 2924/14* (2013.01); *H01L 2924/181* (2013.01); *H01L 2924/19041* (2013.01); *H01L 2924/30107* (2013.01); *Y10T 29/53174* (2015.01); *Y10T 29/53178* (2015.01); *Y10T 29/53183* (2015.01)

(56) References Cited

U.S. PATENT DOCUMENTS

| | | | | |
|---|---|---|---|---|
| 7,701,252 | B1 * | 4/2010 | Chow | H01L 25/0657 326/101 |
| 7,999,367 | B2 * | 8/2011 | Kang | G11C 5/025 257/686 |
| 8,233,303 | B2 * | 7/2012 | Best | G11C 11/4096 365/51 |
| 2006/0076676 | A1 * | 4/2006 | Fratti | H01L 25/0657 257/728 |
| 2009/0052218 | A1 * | 2/2009 | Kang | G11C 5/02 365/51 |
| 2009/0319703 | A1 * | 12/2009 | Chung | G11C 5/02 710/52 |
| 2010/0007029 | A1 * | 1/2010 | Do | H01L 21/568 257/774 |
| 2011/0049577 | A1 * | 3/2011 | Or-Bach | G03F 9/7076 257/209 |

\* cited by examiner

STACKING INTEGRATED CIRCUITS CONTAINING SERIALIZER AND DESERIALIZER BLOCKS USING THROUGH VIA

This application claims benefit of and is a Continuation of allowed application Ser. No. 16/355,740 filed on Mar. 16, 2019 (now U.S. Pat. No. 10,522,516), whereby allowed application Ser. No. 16/355,740 claims benefit of and is a Continuation of allowed application Ser. No. 13/192,217 filed on Jul. 27, 2011 (now U.S. Pat. No. 10,236,275), whereby allowed application Ser. No. 13/192,217 claims benefit of and is a Continuation of allowed application Ser. No. 12/205,875 filed on Sep. 6, 2008 (now U.S. Pat. No. 8,014,166). The entire contents of each of the above-identified applications are hereby incorporated by reference in their entirety.

BACKGROUND OF THE INVENTION

A Serializer/Deserializer (SER/DES) is a pair of functional blocks [integrated circuits or IC/chip] commonly used in high speed communications. These blocks convert data between serial data and parallel interfaces in each direction. Although the term "SER/DES" is generic, in speech it is sometimes used as a more pronounceable synonym for Serial Gigabit Media Independent Interface (SGMII).

SER/DES chips facilitate the transmission of parallel data between two points over serial streams, reducing the number of data paths and thus, the number of connecting pins or wires required. Most SER/DES devices are capable of full duplex operation, meaning that data conversion can take place in both directions simultaneously. SER/DES chips are used in many application including Gigabit Ethernet systems, wireless network routers, fiber optic communications systems, storage applications just to name a few.

Specifications and speeds vary depending on the needs of the user and on the application. These blocks are often integrated within another Integrated Circuit (i.e. ASIC).

The quest for "smaller, cheaper, faster" devices is ever increasing. IC packaging is one area that this quest is continuously challenged. In IC packaging chips are mounted on and connected to a rigid laminate (substrate) via wirebonds (FIG. 1) or bumps in flip chip (FIG. 2) applications. FIG. 1 illustrates an IC packaging chip having a mold (101) and die attach material (105). In wirebond technology (FIG. 1) the silicon die (102) is connected via wires (108) to metal layer (106) over a rigid laminate (103). The metal layer (106) is then connected to solder balls (104) through Via holes (107) inside the rigid laminate (103). In flip chip technology (FIG. 2), the silicon die (201) is connected to a substrate (203) via balls (202) and the substrate (203) routes the metal to proper solder balls (204).

Packaging SER/DES is a very challenging and specialized area in the world if IC packaging. With higher data rate flip chips are adapted for packaging high speed SER/DES because in Flip Chip packaging wirebonds are replaced by conductive solder bumps thereby wirebond inductance is no longer present.

At the present, industry is moving toward 3D packaging where two or more dice are stacked on the top of each other or packages are stacked on the top of packages. These packaging methods offer high density integration in smaller footprint making it suitable for applications in which size matters such as cell phone. FIG. 3 is an example of two equal size chips placed vertically in the same package, in which the chips are connected to the solder balls (305) using wirebond technology. As can be seen from FIG. 3, a first die (301) is placed above a second dies (302), which in turn is placed above a substrate (306). A spacer (303) is placed between the two dies. Another spacer (304) is placed between the bottom die (302) and the substrate (306). FIG. 4 is another example of 3D chip stacking in which the SER/DES die (404) is not stacked and is positioned as a side die beside the stacked dice (401 and 403). FIG. 4 illustrates a stacked die packaging having spacer (402), die attach material (405 and 406), solder balls (407), a rigid laminate (substrate) (408), and via holes or vias (409).

The drawback of stacked die packaging is the use of wirebond, making it unsuitable for high speed SER/DES packaging. In order to circumvent this impediment, this invention proposes to use Through Silicon Via (TSV) to connect dice vertically.

The benefits of using TSV to connect dice vertically are:
1. Higher degree of miniaturization: By placing TSV within the SER/DES block one can facilitate the connection of the die above or below that would otherwise be placed side by side. In a case where non SER/DES dice are stacked with wirebond and SER/DES die is placed next to it, using TSV will eliminate all wires.
2. Placing TSV makes it possible to stack two or more dice with SER/DES block
3. Electrical superiority: When using TSV, it is possible to stack and connect very high data rate SER/DES blocks vertically without the need for any wire.
4. Better thermal performance: The TSV placed within the SER/DES block provides a highly conductive passage for heat removal from the die above.
5. No need for spacer material: Normally, thick Spacer materials are placed between the dice to make wire-bonding of same or different die size possible. Using TSV eliminates the need for this material thereby reducing the cost as well as decreasing the overall height of the package making it possible to fit the package in places where height is a constraint such as very thin cell phones.

This patent claims the placement of TSV within the SER/DES block to enable high density packaging of dice with SER/DES blocks or any other block.

SUMMARY OF THE INVENTION

This invention uses techniques to enable connecting multiple chips (dice) vertically to create a compact 3D chip package. Specifically, it uses techniques that enable high speed SER/DES circuits get connected between multiple dice or from a die to external pins via Through Silicon Via (TSV) that will reduce or eliminate the inductance and capacitance associated with otherwise using wirebond. The techniques for stacking multiple high speed chips enables efficient routing of TSV between different dice that simplifies 3D chip design and manufacturing by providing guidelines on positioning and aligning the chips and by providing guidelines for creating redistribution layer (RDL) and routes that are resistant to stress.

DETAILED DESCRIPTION OF THE PREFERRED EMBODIMENTS

Figure 1:
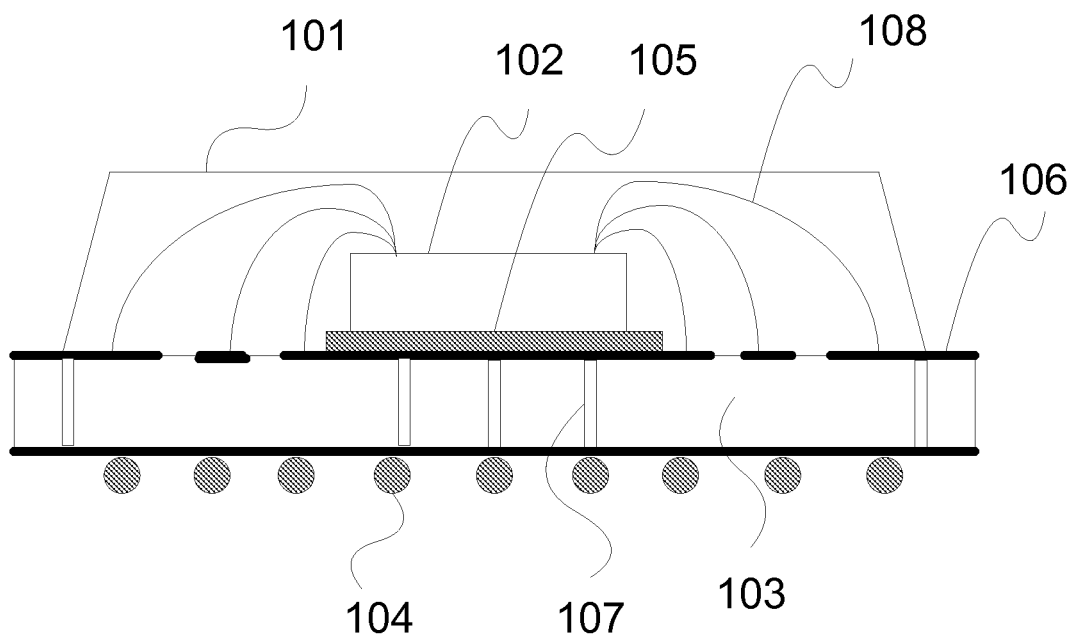
FIG. 1 shows an example of chip with wirebonded package.
Figure 2:
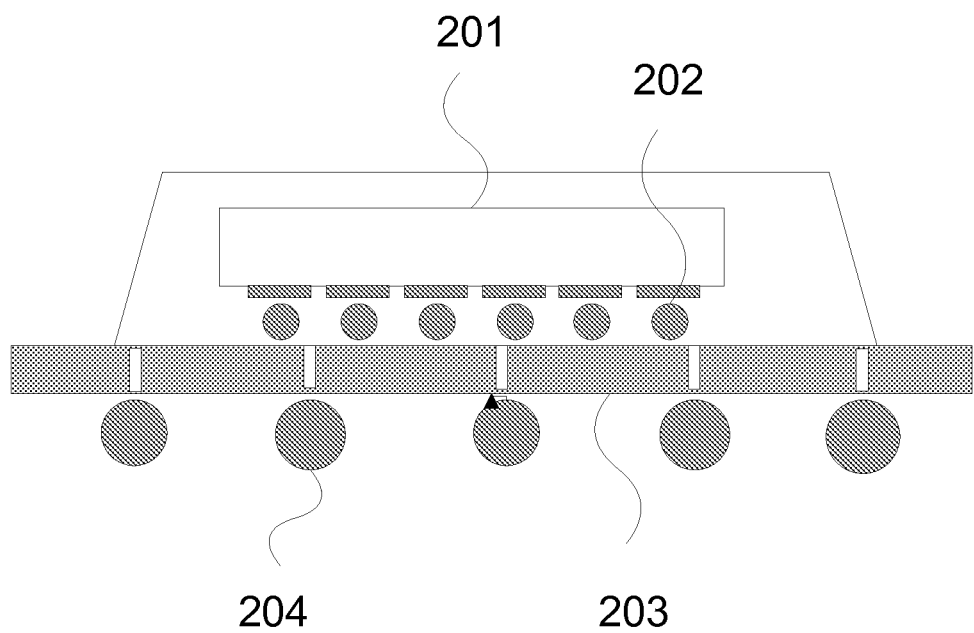
FIG. 2 shows an example of chip with Flip Chip package.
Figure 3:
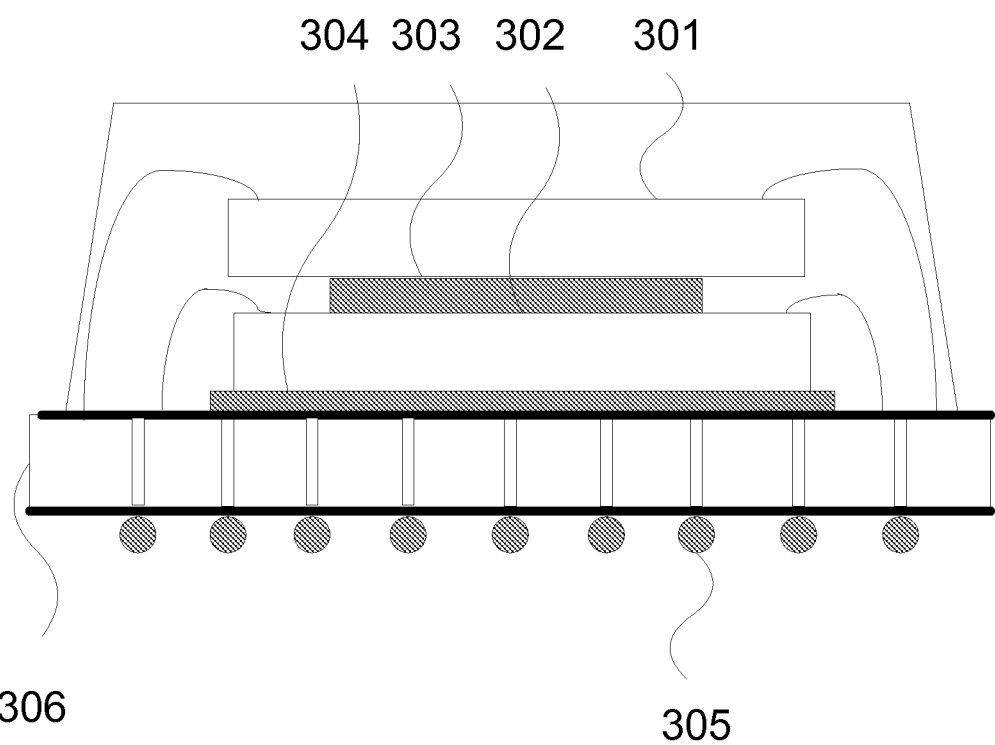
FIG. 3 shows an example of stacked die packing of two chips of the same size using wirebond.
Figure 4:
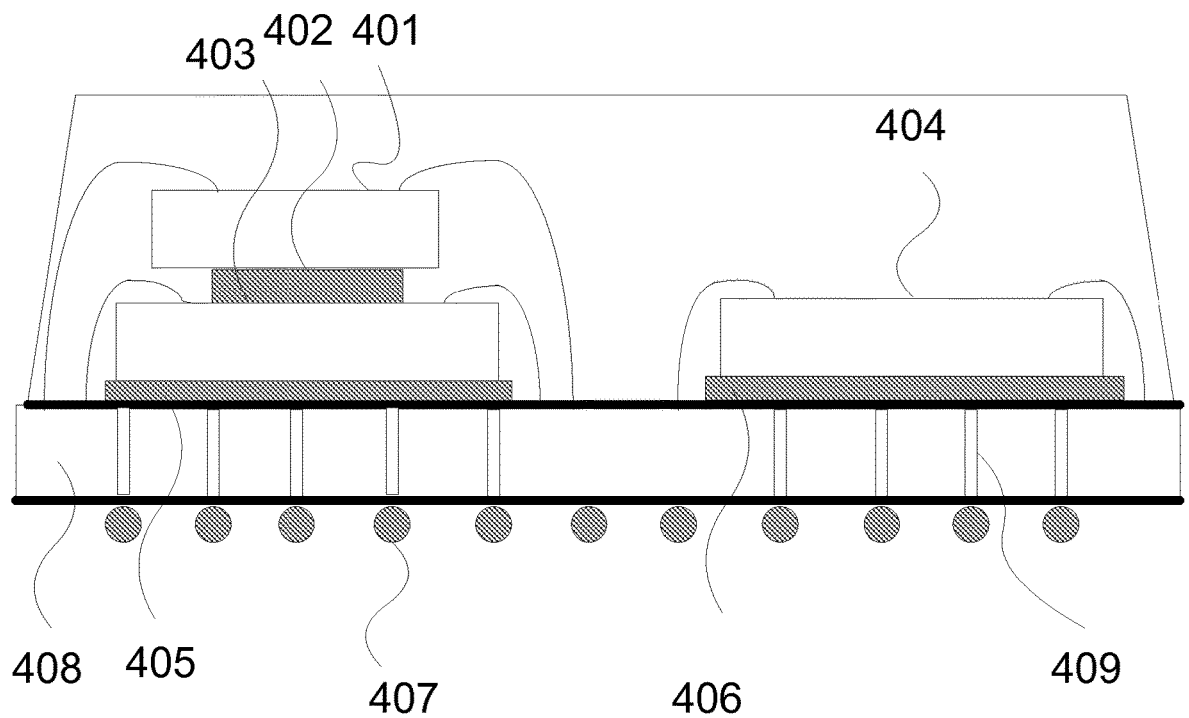
FIG. 4 shows an example of stacked die packing of two chips with a separate SER/DES die in the same package using wirebond.

To create a more compact and space efficient integrated circuit, it is necessary to be able to stack multiple dice on top of each other. Two general methods are possible for interconnecting the stacked dice to each other and for connecting those dice to the pins or solder balls of the 3D chip package. One method is to use wirebond, meaning that to use wires to connect chips to each other or to the pins of the 3D package as shown in FIG. 3 and FIG. 4. The wirebond technique is not very useful for high speed SER/DES due to creation of inductance and capacitance.

Figure 8:
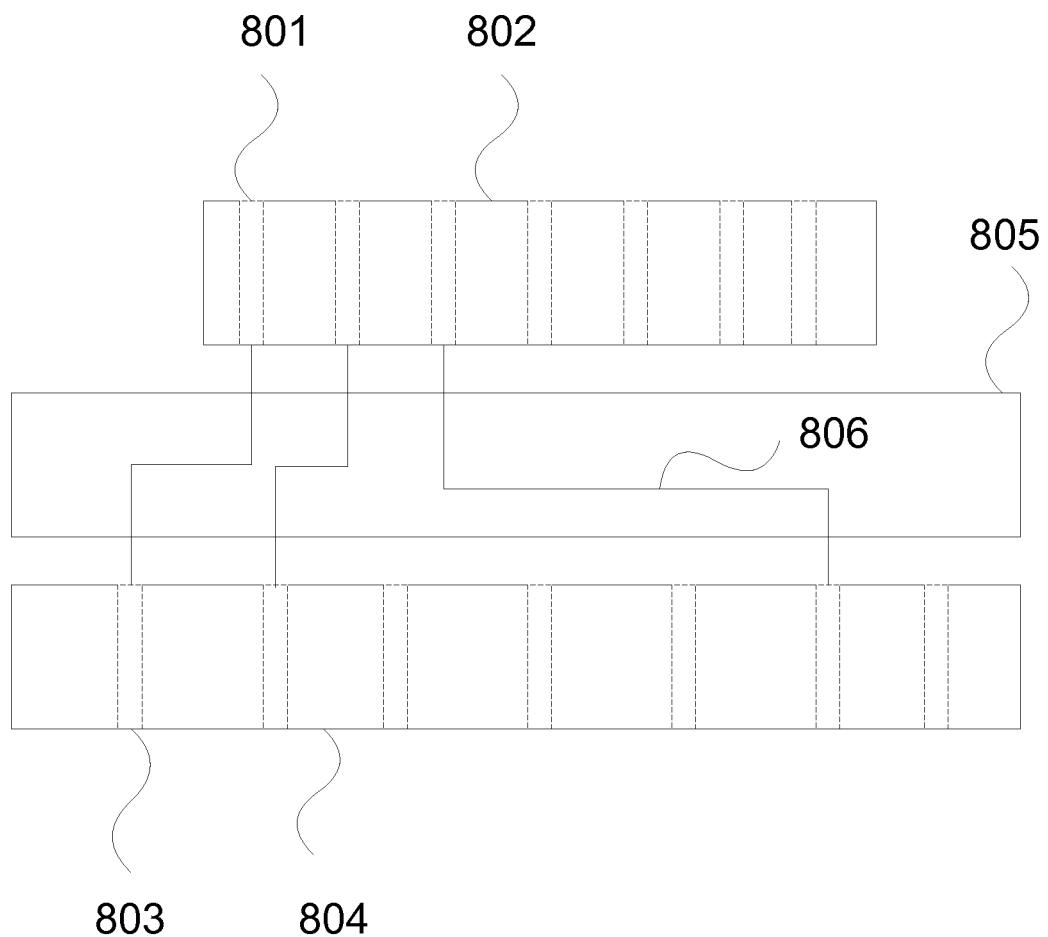
FIG. 8 shows two chips with TSVs connected to each other through a redistribution layer (Interposer).
Figure 9:
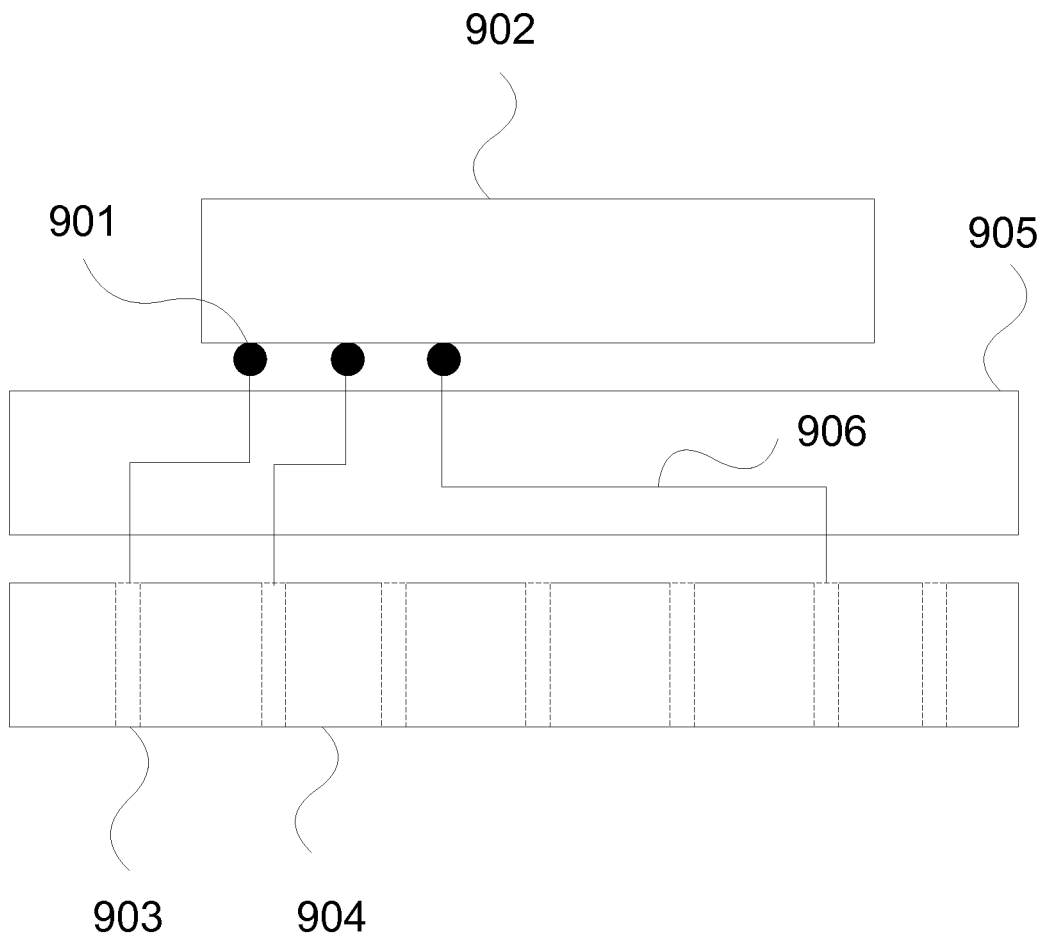
FIG. 9 shows TSVs of one chip connected to the pads of another chip through a redistribution layer (Interposer).

Another technique is to use Through Silicon Via (TSV) to connect multiple stacked dice to each other or to the external pins. FIG. 8 shows an example of TSVs (801, 803) of two dice (802, 804) connected to each other. While FIG. 9 shows the contact pads (901) of one die (902) is connected to the TSVs (903) of another die (904) using RDLs (906). FIG. 9 illustrates an interposer (substrate) (905). TSVs has so far been only used for lower speed integrated circuits. This patent extends the TSV technology for usage with high speed SER/DES circuits. Doing so would eliminate the need for wirebond and would create a more compact package with superior electrical and thermal characteristics.

Figure 10:
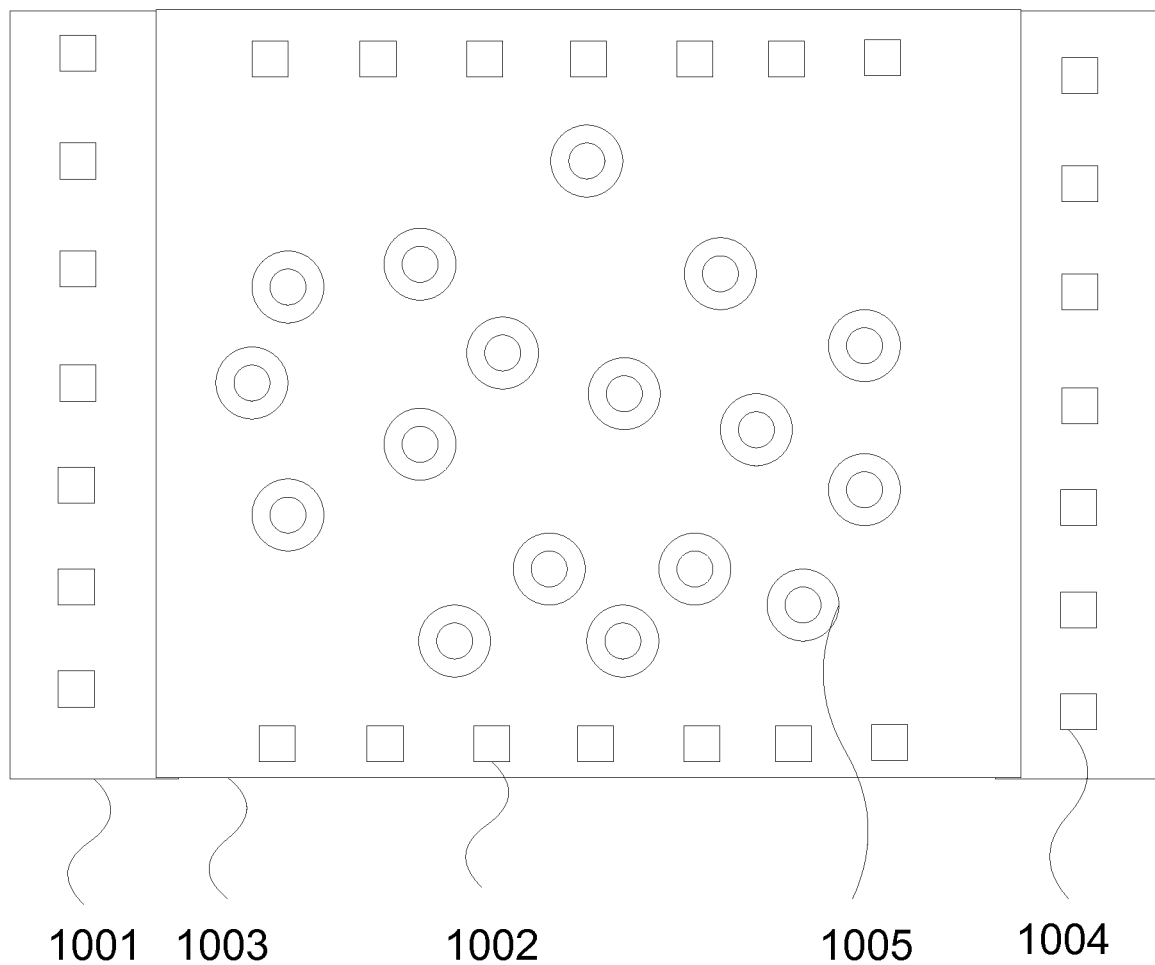
FIG. 10 shows the location of test pads at the very edge of dice, when they are stacked on each other.

And, finally, to test dice which are stacked on each other, test pads need to be created for each die. The test pads must be located at the extreme periphery or edge of dice. FIG. 10 shows two dice (1001, 1003) are stacked on top of each other. They both have TSVs (1005) and the test pads (1002, 1004) are placed at the edge of these dice.

In order to successfully use TSV for the SER/DES circuits a number of rules have to be followed. This patent provides the techniques for using TSV in high speed SER/DES block of chips that could be used for connecting the SER/DES circuit to external pins.

Figure 5:
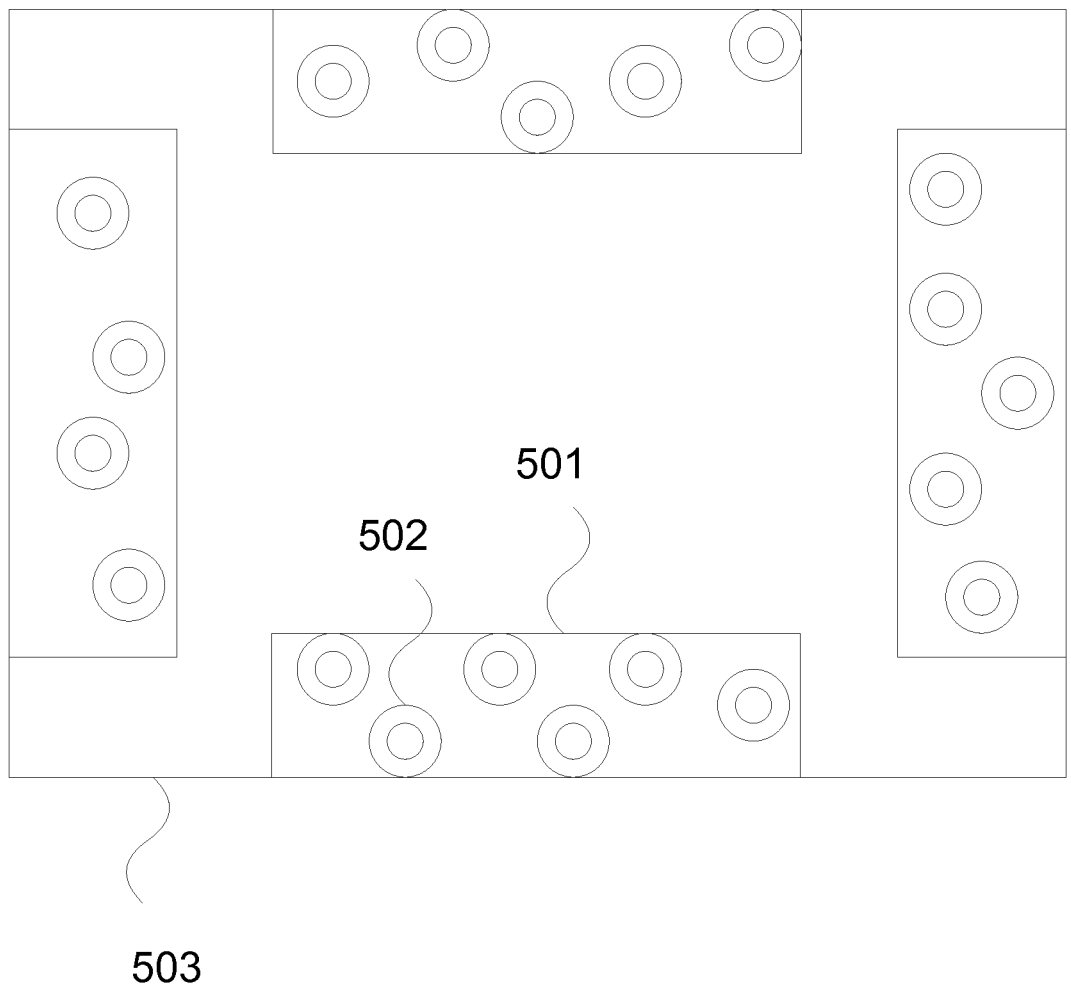
FIG. 5 shows an example of Trough Silicon Via (TSV) on the SER/DES blocks of a chip placed at the peripheries of the chip.

The first technique is to have the SER/DES blocks that use TSV at one or more peripheries of the die. FIG. 5 is an example of such method in which four SER/DES blocks (501) are used at the four peripheries of the die (503) and the SER/DES blocks are equipped with TSVs (502) that can be used to pass through lower dice and get connected to external pins or other dice.

The second technique is to try to limit the SER/DES blocks that use TSV to one or more peripheries of the die and rotate the upper and lower stacked dice by 90 degrees or have the SER/DES staggered so that the SER/DES blocks of those dice will not block each other. This method makes the TSV creation and routing in the interposer layer much easier.

Figure 6:
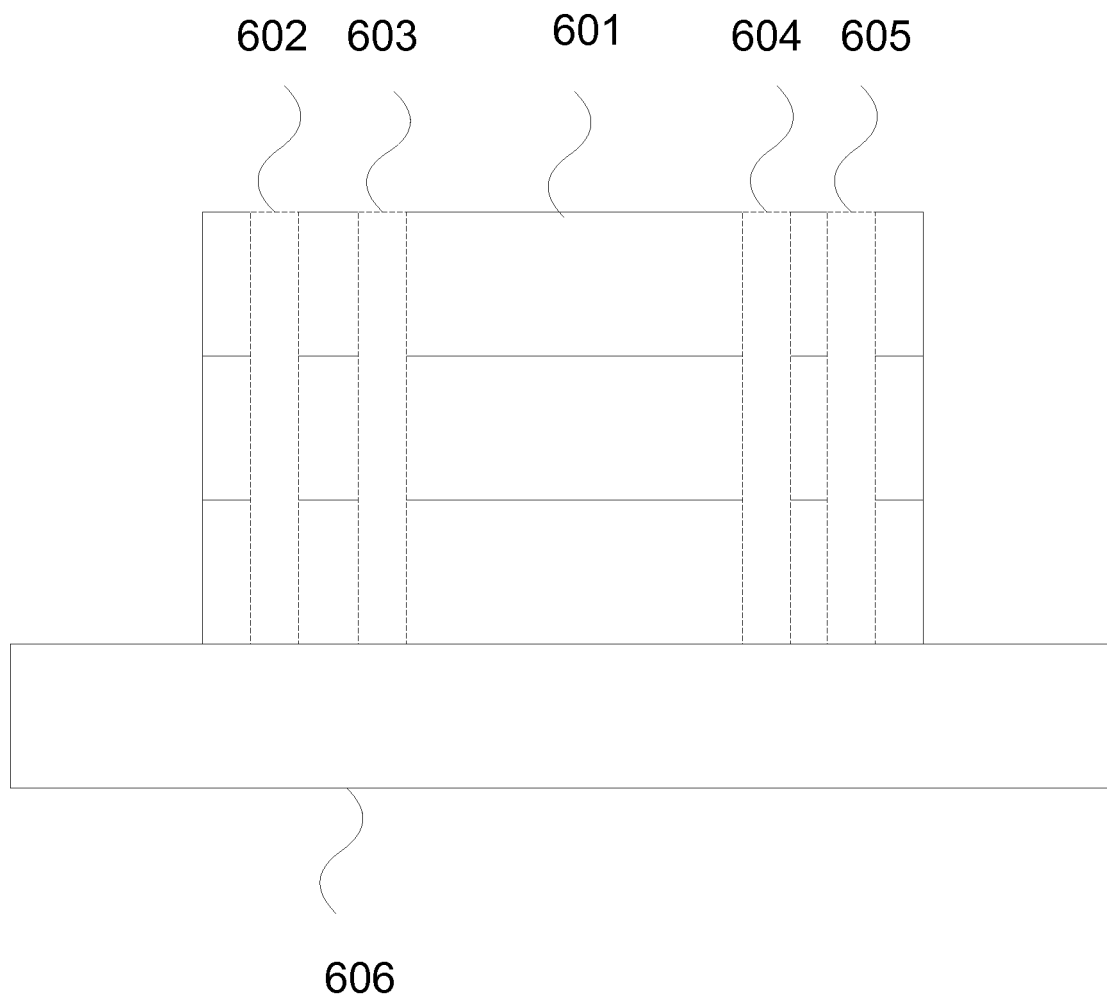
FIG. 6 shows three stacked chips connected to substrate via TSVs.
Figure 7:
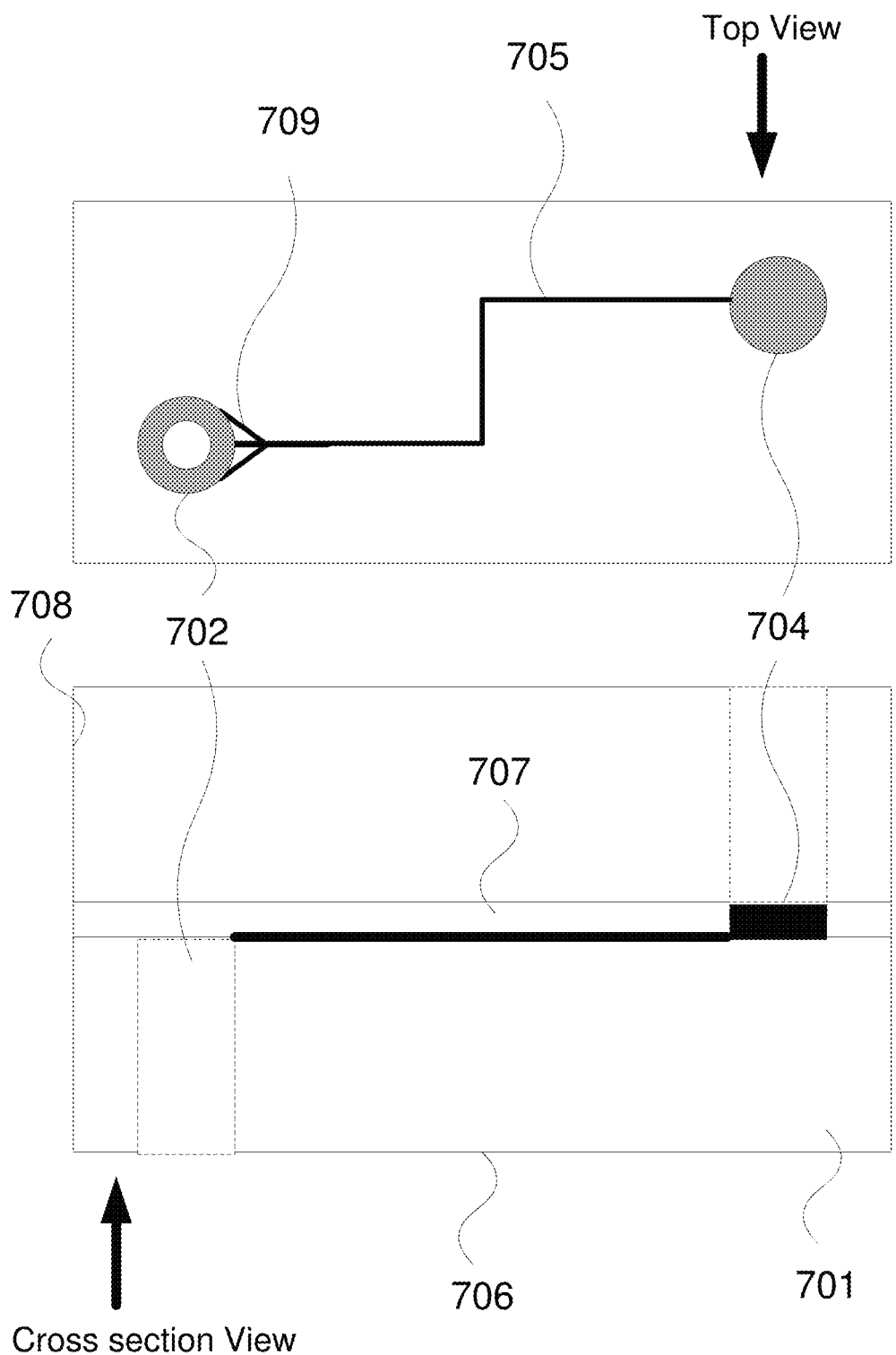
FIG. 7 shows redistribution layer (Interposer) that is used to route and connected TSVs and Pads.

The third technique is to use a redistribution layer (RDL) or interposer when TSVs of the lower and upper die can't be aligned to each other. Redistribution layer (RDL) is used to route and connect TSV to "contact pad". The trace routes can be of any shape, angle or material. There could be solder resist on the top of RDL and adhesive such as (BCB), etc. FIG. 6 shows an example in which the TSVs (602, 603, 604 and 605) of 3 stacked dice are aligned to each other and therefore no RDL is required. FIG. 6 illustrates three stacked chips connected to a substrate having a die (601) and an interposer (substrate) (606). While FIG. 7 shows an example, in which the TSVs of the two dice (706, 708) are not aligned to each other and therefore an RDL (707) is required between two dice (706, 708) to route the TSVs. The RDL may contain TSV, blind via, buried via, or any combination of via. The RDL may or may not contain plans, or passive elements such as capacitors. FIG. 8 shows another example of a RDL (806) that is used to connect the via (801) of the top die (802) to the via (803) of the bottom die (804). FIG. 8 illustrates an interposer (substrate) (805).

Figure 11A:
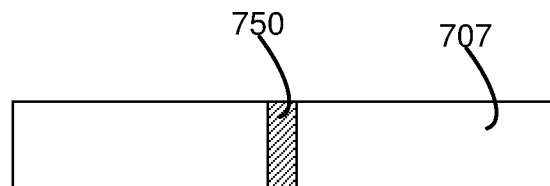
FIG. 11A is a side view of an interposer having formed therein a TSV, in accordance with one embodiment of the present invention.
Figure 11B:
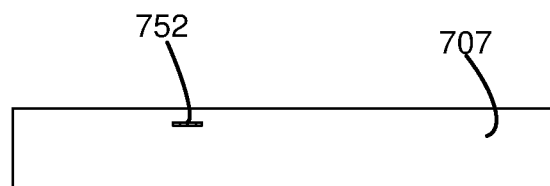
FIG. 11B is a side view of an interposer having disposed therein a passive component, in accordance with one embodiment of the present invention.
Figure 11C:
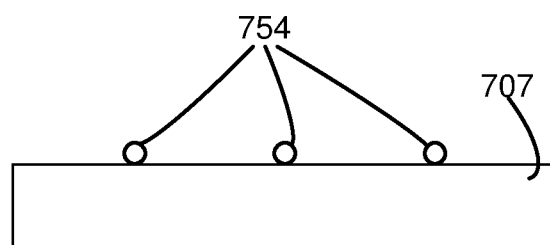
FIG. 11C is a side view of an interposer having a multitude of solder balls disposed on its top surface, in accordance with one embodiment of the present invention.
Figure 11D:
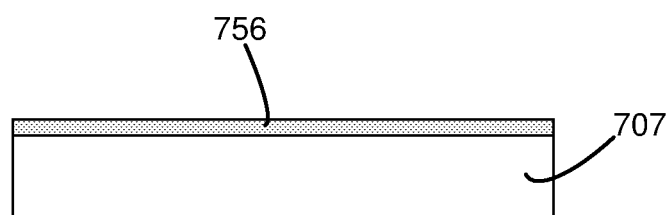
FIG. 11D is a side view of an interposer having an adhesive layer formed on its top surface, in accordance with one embodiment of the present invention.

FIG. 11A is a side view of interposer 707 shown as including a TSV 750, in accordance with one embodiment of the present invention. FIG. 11B is a sideview of interposer 707 shown as including a passive component, such as capacitor 752, in accordance with one embodiment of the present invention. FIG. 11C is a sideview of interposer 707 shown as including solder balls 754 on its top surface, in accordance with one embodiment of the present invention. FIG. 11D is a sideview of interposer 707 shown as including adhesive layer 756 on its top surface, in accordance with one embodiment of the present invention.

The fourth technique is the method for aligning stacked dice. Dice can be aligned using fiducials of any type, such as cross, square, circle, +, −, =, etc, or any text character. Fiducials can be used on the interposer and/or dice for the purpose of alignment. The interposer and dice can have one, two or as many Fiducials, as needed.

The fifth technique is to create (deposit) contact pads on RDL to create a contact point for the other dice TSV. This pad can of any material, size or shape. A circular contact pad (704) is shown in FIG. 7 that resides in the RDL (707). The contact pad (704) is used to connect the TSV of the upper layer dice (708) to the trace (705) on the RDL and subsequently to the TSV of the lower die (702).

The sixth technique is use tear drops for connecting traces on the RDL to TSVs for the purposes of reinforcement and stress reduction. FIG. 7 shows an example of a tear drop (709) on the TSV of the lower die (702).

Figure 12A:
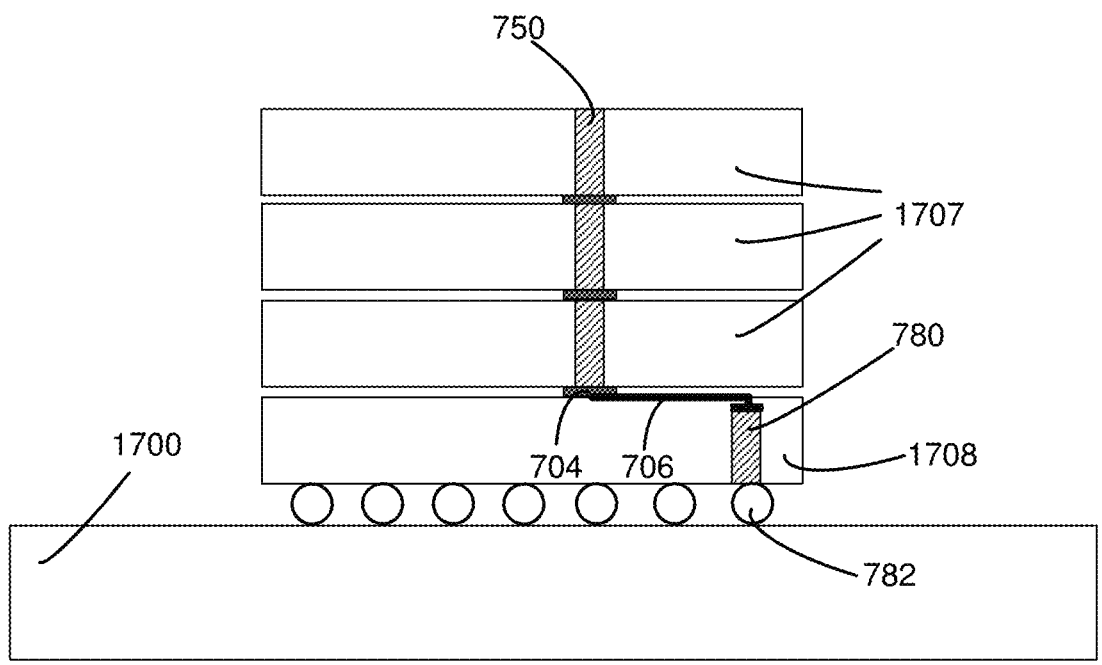
FIG. 12A illustrates dies 1707 with TSV 650 stacked on the top of a Ser/Des die/substrate 1708 where TSV 780 and RDL 706 is used to connect the contact pad 704 to TSV 780 and die/substrate 1708 is coupled to die/substrate 1700 using solder bumps 782 in accordance with at least one embodiment of the resent invention.
Figure 12B:
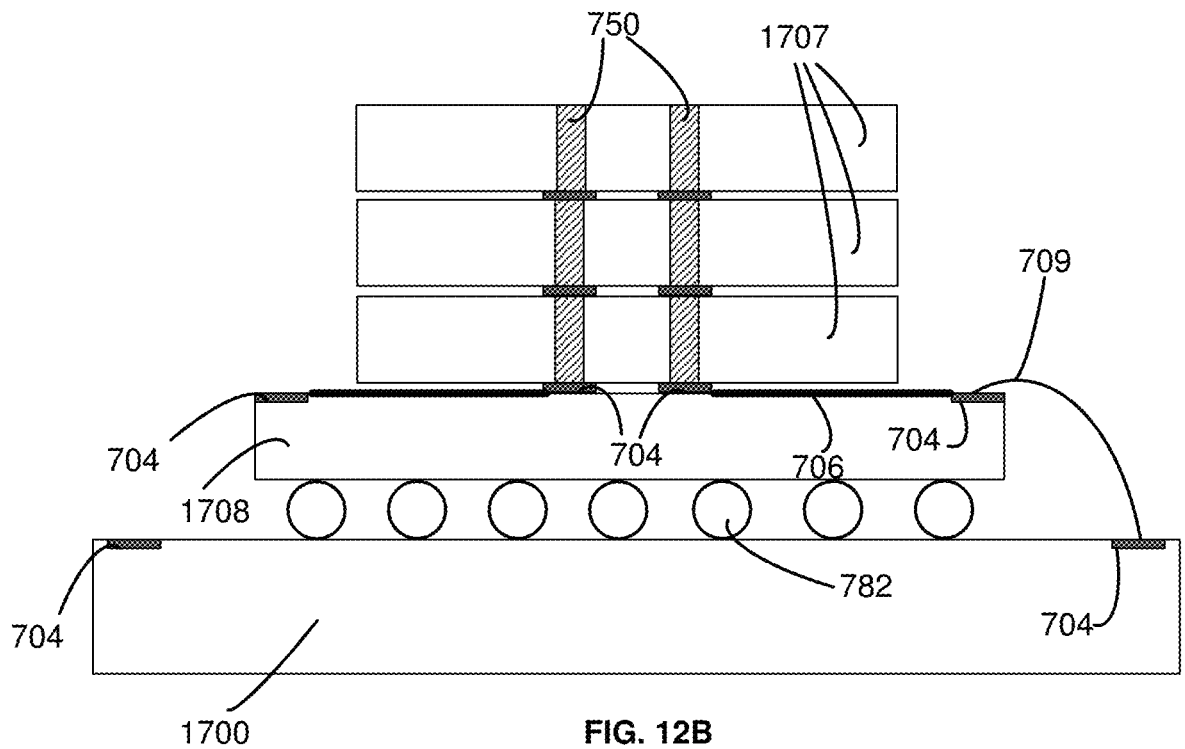
FIG. 12B illustrates die/substrate 1708, where wirebond 709 is used to couple the die/substrate contact pad 704 to die/substrate 1700 contact pad 704 in accordance with at least one embodiment of the present invention.

The seventh technique is mix wirebond and TSV in stacked chips. Wirebond could be used for low speed digital circuits, while TSV could be used for the high speed SER/DES circuits. For example, FIG. 12A shows dies 1707 with TSV 650 stacked on the top of a Ser/Des die/substrate 1708 where TSV 780 and RDL 706 is used to connect the contact ad 704 to TSV 780 and die/substrate 1708 is coupled to die/substrate 1700 using solder bumps 782. In another example, FIG. 12B shows die/substrate 1708, where wirebond 709 is used to couple the die/substrate contact pad 704 to die/substrate 1700 contact pad 704.

The eight technique is to place the test pads for testing a dies that uses TSV at the extreme periphery of the die.

Any variations of the above are also intended to be covered by the application here.

The invention claimed is:

1. A system comprising:
a first die;
a die stack, wherein
    said die stack includes at least:
        a second die, and
        a third die,
    the third die is stacked vertically on top of the second die;
a fourth die;
at least one Redistribution Layer(s);
one or more Through Via(s);
one or more Serial I/O(s);
one or more contact pad(s);
one or more wirebond(s); and
a substrate, wherein
    said substrate includes said at least one Redistribution Layer(s) and one or more Through Via(s),
    said first die is stacked on said fourth die,
    said die stack is stacked on said fourth die,
    at least one of the first, second, third or fourth dies includes at least said one or more Through Via(s), said at least one Redistribution Layer(s), said one or more contact pad(s), said one or more Serial I/O(s) and said one or more wirebond(s),
    said fourth die is coupled to said substrate,
    said one or more Serial I/O(s) is/are configured to communicate through said one or more Through Via(s) and through said at least one Redistribution Layer(s), and
    said one or more contact pad(s) is/are located along at least one edge of at least one of the first die, the second die, the third die, or the fourth die.

2. The system according to claim 1, wherein
said second die and said third die are stacked where said at least one Redistribution Layer(s) are not stacked between them.

3. The system according to claim 1, wherein
said die stack comprises of the same type of dies.

4. The system according to claim 1, wherein
said die stack and/or first die communicate through said one or more Serial I/O(s).

5. The system according to claim 1, wherein
only said fourth die comprises of said one or more Serial I/O(s).

6. The system according to claim 1, wherein
only said die stack is wirebonded to said substrate.

7. The system according to claim 1, wherein
only said first die is wirebonded to said substrate.

8. The system according to claim 1, wherein
said first die and said die stack are wirebonded to each other.

9. The system according to claim 1, wherein
said die stack and/or said first die comprises of said one or more Serial I/O(s).

10. The system according to claim 1, wherein
said die stack, first die and forth die comprises of different type of dies.

11. A system comprising:
a plurality of dies, wherein
    said plurality of dies include at least a first die and a second die;
at least one Redistribution Layer(s);
one or more Through Via(s);
one or more circuit block(s);
one or more wirebond(s);
one or more Serial I/O(s);
one or more contact pad(s); and
at least one substrate, wherein
    said one or more die(s) contain(s) said one or more circuit block(s) and said one or more Serial I/O(s),
    said plurality of dies are formed in a vertical stack configuration by being stacked one on top of another,
    said one or more Through Via(s) is/are coupled to said one or more circuit block(s) and the one or more Serial I/O(s),
    said first die and said second die are stacked and coupled with one another,
    said first die and said second die are stacked and are in direct contact without any substrate or spacer or interposer in between them,
    said plurality of dies are coupled to said at least one Redistribution Layer(s),
    said one or more contact pad(s) is/are coupled to said at least one Redistribution Layer(s),
    said plurality of dies are coupled to said one or more contact pad(s), and
    only the first die is wirebonded to the at least one substrate.

12. The system according to claim 11, wherein
said one or more circuit block(s) is a memory circuit block(s).

13. The system according to claim 11, wherein
at least one of the first die, the second die, a third die, or a fourth die has no Through Via(s).

14. The system according to claim 11, wherein
only one of the first die, the second die, a third die, or a fourth die comprise of said one or more Serial I/O(s).

15. The system according to claim 11, wherein
only one of the first die, the second die, a third die, or a fourth die comprises of wirebond.

16. The system according to claim 11, wherein
said plurality of dies comprises are the same type of dies.

17. The system according to claim 11, wherein
said plurality of dies includes different types of dies.

18. The system according to claim 11, wherein
only said first die comprises of said one or more Serial I/O(s).

19. The system according to claim 11, wherein
any of said plurality of dies comprises of said one or more Serial I/O(s).

20. The system according to claim 11, wherein
only said one or more Serial I/O(s) is wirebonded to said substrate.

21. The system according to claim 11, wherein
said first die has no Through Via(s) and is wirebonded to said substrate.

22. The system according to claim 11, wherein at least one die of said plurality of dies has no Through Via(s).

\* \* \* \* \*